(12) United States Patent
Chang et al.

(10) Patent No.: US 9,466,371 B2
(45) Date of Patent: Oct. 11, 2016

(54) TRANSISTOR AND CIRCUIT USING SAME

(71) Applicant: MACRONIX INTERNATIONAL CO., LTD., Hsinchu (TW)

(72) Inventors: Yi-Peng Chang, Hsinchu (TW); Yin-Jen Chen, New Taipei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 23 days.

(21) Appl. No.: 14/446,037

(22) Filed: Jul. 29, 2014

(65) Prior Publication Data

US 2016/0035422 A1     Feb. 4, 2016

(51) Int. Cl.
| | |
|---|---|
| *H01L 29/76* | (2006.01) |
| *G11C 16/08* | (2006.01) |
| *H01L 29/40* | (2006.01) |
| *G11C 16/04* | (2006.01) |
| *H01L 27/02* | (2006.01) |

(52) U.S. Cl.
CPC ............ *G11C 16/08* (2013.01); *G11C 16/0466* (2013.01); *H01L 27/0251* (2013.01); *H01L 29/402* (2013.01); *H01L 29/404* (2013.01)

(58) Field of Classification Search
CPC ............. H01L 23/4824; H01L 23/528; H01L 29/402; H01L 29/404; H01L 29/41758; H01L 29/41775; H01L 29/66659; H01L 29/7835; H01L 2924/0002; H01L 27/11568; G11C 16/08; G11C 8/08
See application file for complete search history.

(56) References Cited

U.S. PATENT DOCUMENTS

| | | | |
|---|---|---|---|
| 7,177,169 B2 | 2/2007 | Scheuerlein | |
| 7,180,785 B2 | 2/2007 | Kurihara | |
| 7,700,997 B2 | 4/2010 | Futatsuyama et al. | |
| 8,363,505 B2 | 1/2013 | Chang et al. | |
| 8,654,591 B2 | 2/2014 | Akaogi | |
| 2004/0099923 A1* | 5/2004 | Tihanyi | H01L 29/0634 257/500 |
| 2005/0098846 A1* | 5/2005 | Nagaoka | H01L 29/0634 257/487 |
| 2005/0253167 A1* | 11/2005 | Wu | H01L 29/812 257/192 |
| 2007/0138552 A1* | 6/2007 | Chang | H01L 29/408 257/344 |
| 2007/0284673 A1* | 12/2007 | Cascino | H01L 29/42368 257/408 |
| 2008/0272403 A1* | 11/2008 | Saha | H01L 29/1058 257/256 |
| 2012/0068772 A1* | 3/2012 | Murad | H01L 29/402 330/296 |
| 2013/0100758 A1 | 4/2013 | Chen et al. | |
| 2013/0148445 A1 | 6/2013 | Chen et al. | |
| 2014/0175526 A1* | 6/2014 | Hsieh | H01L 23/4824 257/288 |
| 2014/0226427 A1 | 8/2014 | Kim et al. | |
| 2014/0254284 A1 | 9/2014 | Hung et al. | |
| 2014/0286097 A1* | 9/2014 | Lue | H01L 21/28273 365/185.09 |

OTHER PUBLICATIONS

Tomiye et al., "A novel 2-bitkell MONOS memory device with a wrapped-control-gate structure that applies source-side hot-electron injection," 2002 Symposium on VLSI Technology.*

* cited by examiner

*Primary Examiner* — A. Sefer
(74) *Attorney, Agent, or Firm* — Haynes Beffel & Wolfeld LLP (57) ABSTRACT

A transistor is described including a fly-over conductor. The transistor has a gate, a channel and a source/drain terminal. The fly-over conductor is disposed over the source/drain terminal. A circuit is connected to the fly-over conductor to apply a bias voltage tending to offset effects on the transistor of charge trapped in insulating material. A word line driver can include a transistor with a fly-over conductor.

16 Claims, 7 Drawing Sheets

TRANSISTOR AND CIRCUIT USING SAME

BACKGROUND OF THE INVENTION

1. Field of the Invention

The present invention relates to transistors in integrated circuits, including transistors suitable for use as high voltage pass transistors like those utilized in some decoding structures for high density memory.

2. Description of Related Art

In high density memory, the arrays of memory cells are often divided into a plurality of blocks of memory cells. Each block of memory cells may include local word lines, requiring corresponding local word line drivers. In these configurations, there can be a global word line driver which drives a set of global word lines for a column of blocks in the array. Each word line in the set of global word lines is set according to the operation being applied to the selected blocks, such as read, program, and erase for high density flash devices. Some operations can require high voltages and some can require negative voltages for some types of memory devices. As a result, word line drivers are required that can meet difficult high voltage and negative voltage operating parameters.

Word line drivers in these environments can include pass transistors which are used to transfer voltages from global word lines to local word lines. These pass transistors can experience high electric fields sufficient to cause unwanted charge trapping in the insulating materials over source/drain terminals. Charge trapped in these locations can create electric fields sufficient to deplete charge carriers in zones near the edges of the channels of the pass transistors. These depletion zones can increase the resistance of the pass transistor when it is operating to transfer voltages. As a result of the increased resistance, a substantial drop in voltage can occur across the device. This drop in voltage can interfere with specified operation of the decoder, and cause other problems.

Transistors utilized in other relatively high voltage environments can experience similar problems.

Thus it is desirable to provide a technology which can address problems arising because of unwanted charge trapping in high voltage transistors, and a technology for deploying such transistors in high density memory devices.

SUMMARY OF THE INVENTION

A transistor is described which is suitable for use in an environment suffering stress caused by unwanted trapped charge in the insulating layers near the gate and source/drain terminal of the transistor. The transistor includes a fly-over conductor over the source/drain terminal, overlying an insulating structure near the gate in which unwanted trapped charge can accumulate. A circuit applies a bias voltage to the fly-over conductor which can offset the effects of unwanted trapped charge.

A memory device is described deploying a transistor including a fly-over conductor in a driver for a row/column line, such as for a local word line.

Manufacturing methods are described for producing a device including a transistor with a fly-over conductor. Also, methods for operating a transistor to suppress the effect of unwanted trapped charge are provided.

Other aspects and advantages of the present invention can be seen on review of the drawings, the detailed description and the claims, which follow.

DETAILED DESCRIPTION

A detailed description of embodiments of the present invention is provided with reference to the FIGS. 1-7.

Figure 1:
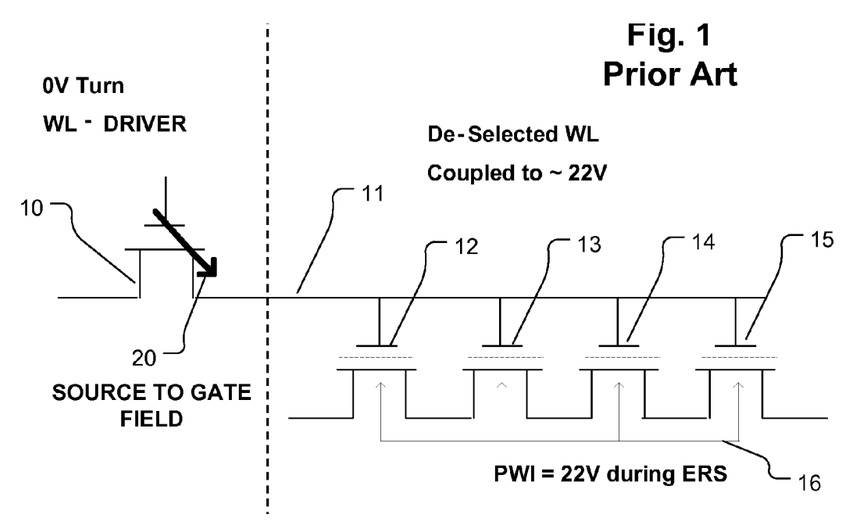
FIG. 1 is a schematic diagram illustrating a transistor in a high voltage environment which can cause hot carrier stress and unwanted charge trapping.

FIG. 1 illustrates an environment in the prior art in which high voltage stress induces hot carriers that can cause unwanted charge trapping in a structure over a source/drain terminal of a transistor, such as a multilayer insulator on a side of a gate of the transistor. In this environment, a transistor 10 is utilized as a pass transistor in a word line driver on a memory device. One of the source/drain terminals of the transistor 10 is connected to a word line 11. A plurality of memory cells 12-15 is coupled to the word line 11. The memory cells comprise flash memory cells in this example, such as dielectric charge trapping cells. Some of the operations executed for flash memory cells involved high voltage. For example, in an erase operation for some memory devices, a high voltage, such as for example 22 V, can be applied to the semiconductor body 16 formed for example in an isolated well on an integrated circuit. For a "de-selected" word line, the transistor 10 is off. This causes the word line 11 to adopt a floating state. High voltage in the body 16 can be capacitively coupled to the word line 11 which induces a strong source-to-gate electric field 20. This electric field can induce hot carriers in the source/drain terminal area which can tunnel into insulating material of the multilayer structure used to form a sidewall on the gate, and become unwanted trapped charge.

Figure 2:
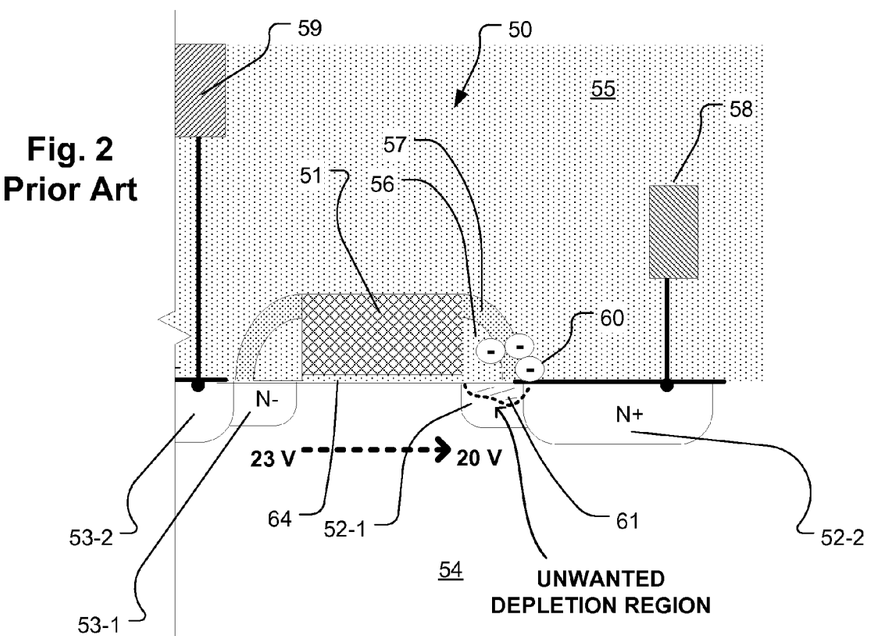
FIG. 2 is a cross-section of a prior art pass transistor structure with unwanted trapped charge.

FIG. 2 illustrates a structure in cross-section of a transistor 50 which could be utilized as the pass transistor 10 in the prior art circuit shown in FIG. 1. The transistor 50 has a gate 51 which overlies a semiconductor body 54. A gate dielectric layer 64 separates the gate 51 from the semiconductor body 54. A first source/drain terminal of the transistor includes a lightly doped region 52-1, and a more heavily doped region 52-2 in the semiconductor body 54. A second source/drain terminal of the transistor includes a lightly doped region 53-1, and a more heavily doped region 53-2 in the semiconductor body 54. The semiconductor body 54 is p-type, and the first and second source/drain terminals are n-type, in this example, resulting in an n-channel transistor having a structure commonly referred to as an N-MOS or as an n-channel MOSFET.

A conductor 58 is electrically connected to the more heavily doped region 52-2 of the first source/drain terminal by a conductive plug or other interlayer connector. A conductor 59 is electrically connected to the more heavily doped region 53-2 of the second source/drain terminal by a conductive plug or other interlayer connector.

In this example, the gate 51, the conductor 58, and the conductor 59 are disposed in different patterned conductor layers on the device. The gate 51 is formed in a patterned polysilicon layer; the conductor 58 is formed in a first patterned metal layer; and the conductor 59 is formed in a second patterned metal layer. Insulating material 55 provides interlayer isolation among the patterned conductor layers. The insulating material includes, in this example, a structure which can trap unwanted charge on the side of the gate 51 and over the more lightly doped region 52-1. The structure is a multilayer insulating structure in this example including spacer element 56 and spacer element 57 on the side of the gate 51. The spacer elements 56 and 57 are different insulating materials in this example, that in combination result in a structure that can readily trap charge. This multilayer insulating structure can be a remnant of the manufacturing process used in the formation of interlayer connectors, or other structures. In the illustrated example, the first spacer element 56 comprises silicon dioxide, and the second spacer element 57 comprises silicon nitride.

Unwanted trapped charge 60 is schematically illustrated in the structure, over the first source/drain terminal. This unwanted trapped charge 60 can be trapped in the insulating material 55, such as in the multilayer insulating structure near the gate 51, and over the more lightly doped region 52-1 of the first source/drain terminal. The unwanted trapped charge 60 can result in a net negative voltage overlying this region on the transistor, which induces an electric field that can cause an unwanted depletion region 61 in or near the channel of the transistor. This unwanted depletion region 61 can increase the resistivity of the transistor even when the channel is on. Thus, as illustrated, if the transistors being utilized to transfer a high voltage, such as 23 V applied to the second source/drain terminal, a substantial voltage drop can be encountered. Thus, the high voltage is reduced by 3 V in this example, so that only 20 V reaches the first source/drain terminal. Thus, the unwanted trapped charge significantly reduces the driving ability of the transistor.

Figure 3:
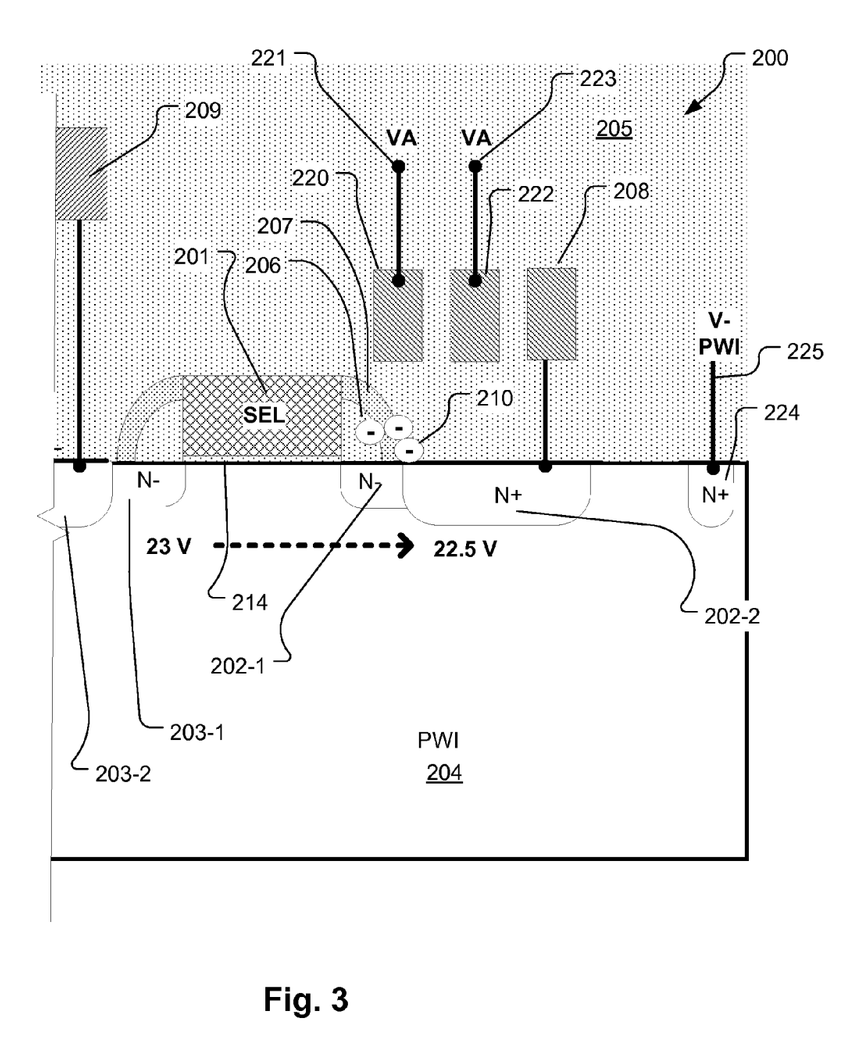
FIG. 3 illustrates a transistor including fly-over conductors as described herein.

FIG. 3 illustrates a structure in cross-section of a transistor 200 including fly-over conductors as described herein, which provide immunity against unwanted trapped charge. The transistor 200 has a gate 201 which overlies the semiconductor body 204. A gate dielectric layer 214 separates the gate 201 from the semiconductor body 54. In this example, the semiconductor body 204 is an internal p-type well of a triple well structure. The triple well is disposed in a p-type substrate (not shown). A deep n-type well (not shown) is disposed in the substrate. The internal p-type well providing the body 204 is disposed in the deep n-type well. A contact terminal 224 which comprises an n-type doped region is used for connecting the internal p-type well to bias circuits, schematically via line 225.

A first source/drain terminal of the transistor 200 includes a lightly doped region 202-1, and a more heavily doped region 202-2 in the body 204. A second source/drain terminal of the transistor includes a lightly doped region 203-1, and a more heavily doped region 203-2 in the body 204. The body 204 is p-type, and the first and second source/drain terminals are n-type in this example, resulting in an n-channel transistor.

Conductor 208 (output conductor in this example) is electrically connected to the more heavily doped region 202-2 of the first source/drain terminal by conductive plug or other interlayer connector, and provides the voltage transferred by the transistor 200 to a destination structure, such as a word line or other row/column line in a memory array. Conductor 209 (input conductor in this example) is electrically connected to the more heavily doped region 203-2 of the second source/drain terminal by a conductive plug or other interlayer connector, and is coupled to circuitry that provides an input voltage to the transistor 200.

Fly-over conductors 220 and 222 are disposed over the first source/drain terminal (202-1, 202-2), between the gate 201 and the contact of the plug for output conductor 208 in the source drain terminal. The fly-over conductors 220 and 222 are separated from the first source/drain terminal and from the gate by insulating fill 205, which can include interlayer dielectric materials.

So, as illustrated in this example, insulating material provides interlayer isolation among the patterned conductor layers as well as other purposes. The insulating material includes, in this example, insulating fill 205, and a multilayer insulating structure which can readily trap charge, including first spacer element 206 and second spacer element 207 on the side of the gate 201. The spacer structure can be a remnant of manufacturing processes used in formation of the interlayer connectors, or other structures. In the illustrated example, the first spacer element 206 comprises silicon dioxide, and the second spacer element 207 comprises silicon nitride. Almost any type of dielectric material used as the insulating material can trap charge in some circumstances, and so the technology is not limited to transistors having silicon dioxide and silicon nitride spacer elements.

Unwanted trapped charge 210 is schematically illustrated in the structure, over the first source/drain terminal including trapped charge over the more lightly doped region 202-1. As discussed above, the unwanted trapped charge can cause an electric field which reduces the driving ability of the transistor 200. The fly-over conductors 220 and 222 are connected to a fly-over conductor bias voltage generator, which applies a bias voltage VA to the fly-over conductors. This bias voltage is to neutralize the electric field induced by the unwanted trapped charge 210 trapped in the insulating material, such as in sidewall spacers 206 or 207.

The gate 201, the conductor 208, and the conductor 209 are disposed in different patterned conductor layers on the device. The gate 201 is formed in a patterned polysilicon layer in this example. The conductor 208 is formed in a first patterned metal layer in this example. The conductor 209 is formed in a second patterned metal layer in this example. In some embodiments, many patterned conductor layers can be disposed on the device, including more than one patterned polysilicon layer in some examples, and more than one patterned metal layer in some examples. The conductors 208 and 209, and the gate 201 can be disposed in selected layers, or even all in the same layer in some embodiments. In some examples, one or both of the conductors 208 and 209 may be replaced by a diffusion region in the substrate which includes the corresponding more heavily doped region (202-2, 203-2) of the source/drain terminal.

The fly-over conductors 220 and 222 are disposed in the same patterned metal layer as that which includes the output conductor 208 in this example. Thus, the fly-over conductors 220 and 222 can be formed in the same deposition and patterning process as utilized for the output conductor 208, without an additional processing step.

In this example, two fly-over conductors 220 and 222 are illustrated. The number of fly-over conductors utilized can be selected according to the needs of a particular embodiment. Both, or all, fly-over conductors 220 and 222 are connected to receive the same bias voltage VA from a bias circuit, or bias circuits, schematically via lines 221, 223, in this example. In other examples, different bias voltages can be applied to the different fly-over conductors disposed for a single transistor. In yet other examples, the fly-over conductors can be electrically connected to, or extensions of, the output conductor 208. The voltages applied to the fly-over conductors can be tuned as suits the performance needs and structures in a particular embodiment. Also, in other embodiments, a single fly-over conductor may be utilized for a single transistor, and disposed between the gate and the output conductor.

For the purposes of this description, a fly-over conductor is disposed "between" the gate and the output conductor when it is disposed between the structures in layout view, even when they are disposed in different patterned conductor layers. Also, a fly-over conductor can be considered "between" the gate and the output conductor even when the sides of the fly-over conductor may overlap with the sides of the gate, or with the sides of the output conductor, so long as the overlap does not substantially interfere with the operation of the fly-over conductor to induce an electric field to address unwanted trapped charge.

In the illustrated example, the transistor 200 is an n-channel MOSFET. In alternative embodiments, p-channel transistors could be utilized.

The transistor structure shown in FIG. 3 is a triple well structure with the semiconductor channel in an isolated well in the substrate. In other embodiments, the transistor can be a thin film transistor with a semiconductor channel body in a thin film layer isolated from an underlying substrate by a layer of insulating material.

Figure 4A:
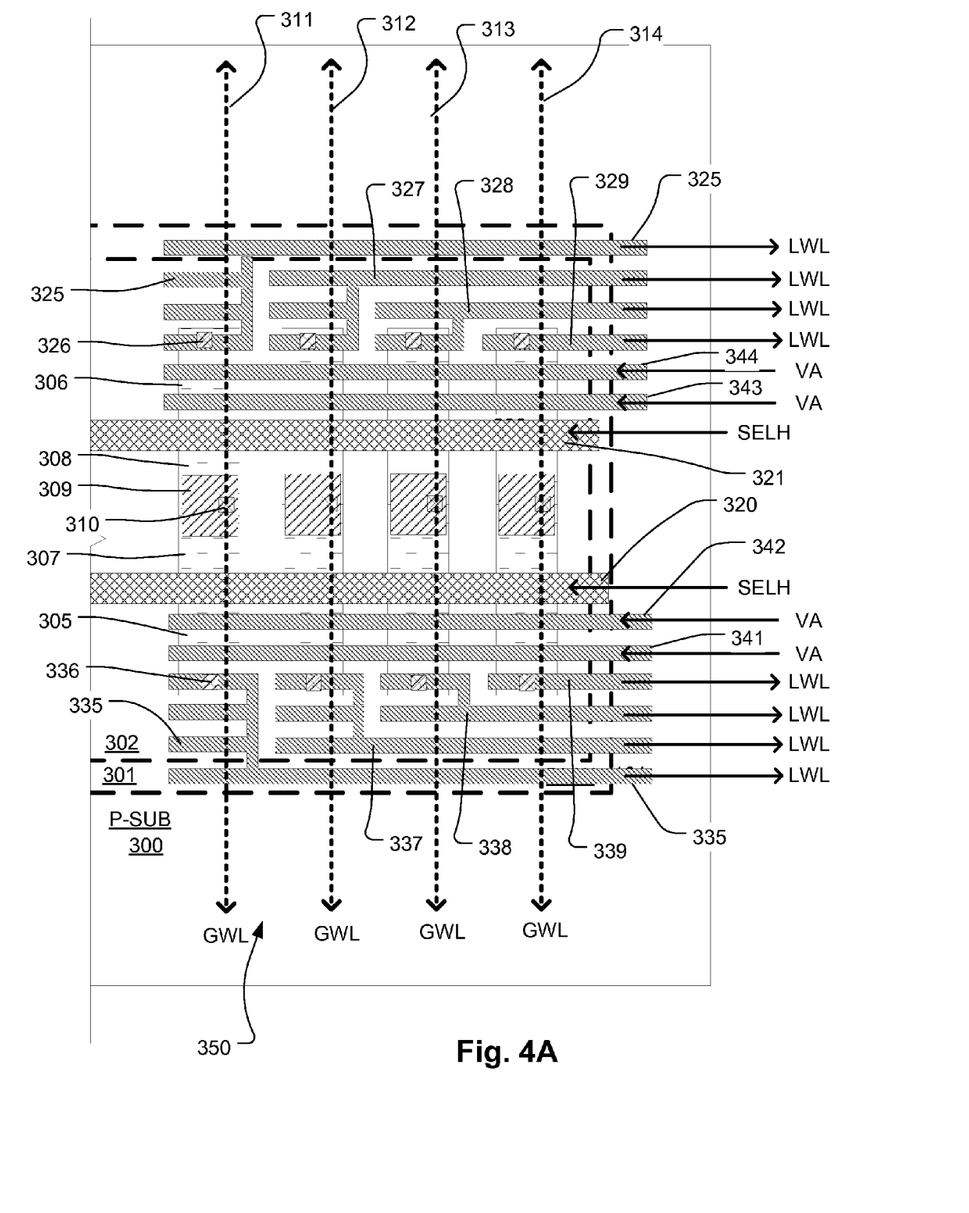
FIG. 4A illustrates the layout of a local word line pass transistor structure for a high density memory including fly-over conductors.

FIG. 4A illustrates in layout view, a pass transistor structure including an array 350 of pass transistors including fly-over conductors, for connecting global word lines to local word lines in a high density memory. In this example, the pass transistors are implemented in a triple well structure to support high voltages and negative voltages applied to local word lines. Thus, for example, the pass transistors are implemented in a p-type substrate 300. The deep n-type well 301 (illustrated by the dashed line perimeter) is implemented in the substrate 300. An internal p-type well 302 (illustrated by the dashed line perimeter) is implemented within the deep n-type well 301. The triple well structure provides isolation of the channel regions of the pass transistors from the grounded substrate.

In this layout, back-to-back pass transistors are illustrated. The pass transistors have gate conductors 320, 321 connected to a select signal SEL which can be generated by a level shifter for the block (See, FIG. 5). Conduction terminals (i.e., source/drain terminals) of the pass transistors are implemented using n-type region (e.g. 305 referring to the leftmost pass transistor in the figure), n-type region (e.g. 306) and n-type region (e.g. 307, 308). The channel regions of the pass transistors are disposed beneath the gate conductors 320, 321. An interlayer contact 310 connects the regions 307, 308 to an overlying conductor layer 309 shown schematically as a single square, but which extends along the GWL line 311 in the figure. An interlayer contact 326, and an interlayer contact 336 connect the regions 306 and 305 respectively to overlying conductors used as local word line connectors 325 and 335 which are electrically connected and extend to local word lines LWL. The conductors used as local word line connectors 325 and 335 include digitated layout features near the contacts 326 and 336, respectively, which extend laterally from the major axes of the local word line connectors 325 and 335.

The overlying conductors which comprise the global word lines 311-314 can be implemented in a patterned conductor layer, such as a metal layer on the device.

The array 350 of pass transistors in this example includes four back-to-back pass transistor structures, for a total of eight pass transistors. There are eight corresponding local word line connectors, including local word line connectors 325, 327, 328, 329 in the upper set on the figure, and local word line connectors 335, 337, 338, 339 in the lower set on the figure. The local word line connectors 325, 327, 328, 329 and 335, 337, 338, 339 extend along parallel major axes in the figure for connection to a local word line fanout structure, which may be implemented in a polysilicon layer for example. In some embodiments, the local word line connectors 325, 327, 328, 329 and 335, 337, 338, 339 can be parts of the same patterned conductor (e.g. a polysilicon conductor) that is deployed in the array as a local word line.

The array 350 of pass transistors also includes fly-over conductors 341, 342, 343 and 344. The fly-over conductors 341, 342 are disposed between the interlayer contact (e.g. 336) and local word line connector (e.g. 335) for each transistor in the lower set, and the gate of the transistor which is connected to, or disposed in, the gate conductors 320. Likewise, the fly-over conductors 343, 344 are disposed between the interlayer contact (e.g. 326) and the local word line connectors (e.g. 325) for each transistor in the upper set, and the gate of the transistor which is connected to, or disposed in, the gate conductor 321. The fly-over conductors 341, 342, 343, 344 are connected to circuits that apply the bias voltage VA as discussed above.

In this embodiment, each of the fly-over conductors is disposed over the source/drain terminals of more than one pass transistor in the array. Also, there are two fly-over conductors disposed over the source/drain terminal of each transistor in the array. In other embodiments, there may be only one fly-over conductor disposed over the source/drain terminal of the transistors in the array. Alternatively, there may be more than two.

In addition, in some embodiments, the fly-over conductors can be connected to separate bias circuitry as mentioned above.

Figure 4B:
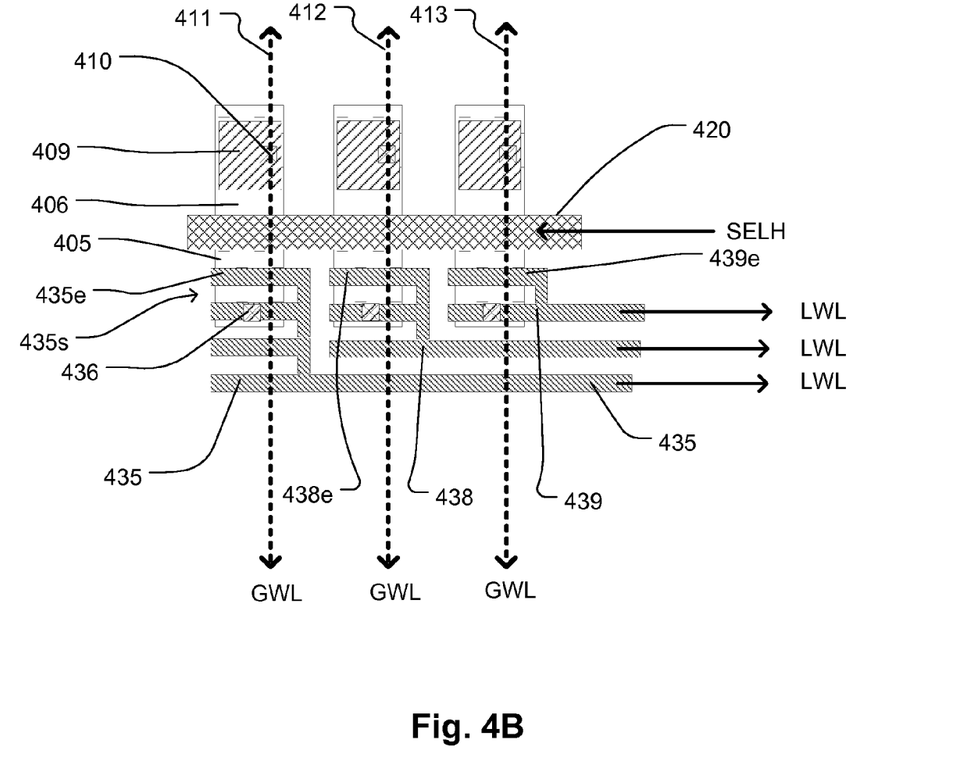
FIG. 4B illustrates the layout of a pass transistor structure like that of FIG. 4A showing an alternative configuration of fly-over conductors.

FIG. 4B illustrates, in layout view, a part of a pass transistor structure like that of FIG. 4A, including another example configuration of fly-over conductors. The pass transistors have a gate conductor 420 connected to a select signal SEL which can be generated by a level shifter for the block (See, FIG. 5). Conduction terminals (i.e., source/drain terminals) of the pass transistors are implemented using an n-type region (e.g. 405, referring to the leftmost pass transistor in the figure), and n-type region (e.g. 406). The channel regions of the pass transistors are disposed beneath the gate conductor 420. An interlayer contact 410 connects the region 406 to an overlying conductor layer 409 shown schematically as a single square, but which extends along the GWL line 411 in the figure. An interlayer contact 436 connects the region 406 to an overlying conductor used as a local word line connector 435, which is electrically connected and extends to a local word line LWL. The conductor used as a local word line connector 435 includes digitated layout features near the contact 436, which extend laterally from the major axis of the local word line connector 435.

The overlying conductors which comprise the global word lines 411-413 can be implemented in a patterned conductor layer, such as a metal layer on the device.

The connectors 435, 438, 439 that act as local word line connectors comprise fly-over conductors in this example consisting of the fingers 435e, 438e, 439e or other forms of extensions on digitated layout features of the word line connectors 435, 438, 439. The word line conductors in this example have digitated layout features which extend laterally from the major axis of the local word line connector 435 with one or more fingers that are parallel to the major axis of the local word line connector 435. In this embodiment, an interlayer contact (e.g. 436) is disposed in a position that is at least one finger away from the gate conductor 420 (i.e., a position which has at least one finger between it and the gate conductor 420). The fingers disposed as fly-over conductors are separated from the other fingers or from the primary local word line connector 435 by an insulating space (e.g. 435s), and are parallel with the major axis of the local word line connector 435. These fingers comprise lengths of material that cross over the source/drain region, between the contact 436 and the gate of the transistor in the gate conductor 420. The fingers 435e, 438e, 439e function as fly-over conductors like the fly-over conductors 341 and 342 of FIG. 4A.

In alternative embodiments, the fly-over conductor can comprise a lateral extension of any practical shape which is part of, or connected by a passive electrical conduction path (i.e. a path without active elements like transistors or diodes) to, the primary conductor (e.g. local word line conductor) that contacts the source drain terminal. The lateral extension is an element which extends outwardly from the side of the conductor where it overlies a contact to the source/drain terminal, as can be defined by an expansion in the extension direction of the width dimension on the major part of the length of the conductor. The extension can overlie the more lightly doped region of the source/drain terminal, overlie a sidewall structure on the side of the gate, or otherwise extend closely enough to the unwanted trapped charge to reduce the effects of the trapped charge on conductivity of the transistor in the ON state.

As a result, the circuits that apply a voltage, such as a high program voltage, to the terminals (e.g. region 406) of the pass transistors also serve to bias the fly-over conductors. In this example, the pass transistor is circuitry configured to apply a bias voltage to the fly-over conductor, tending to offset effects on the transistor of charge trapped in insulating material. Also, it selectively applies the bias voltage when the transistor is turned on. No additional circuitry is required to bias the fly-over conductors, because they are electrically and passively connected to the output conductors without intervening devices. Other examples can be configured that also electrically connect, using passive or active conduction paths, the fly-over conductors with the output conductors of the devices.

Figure 5:
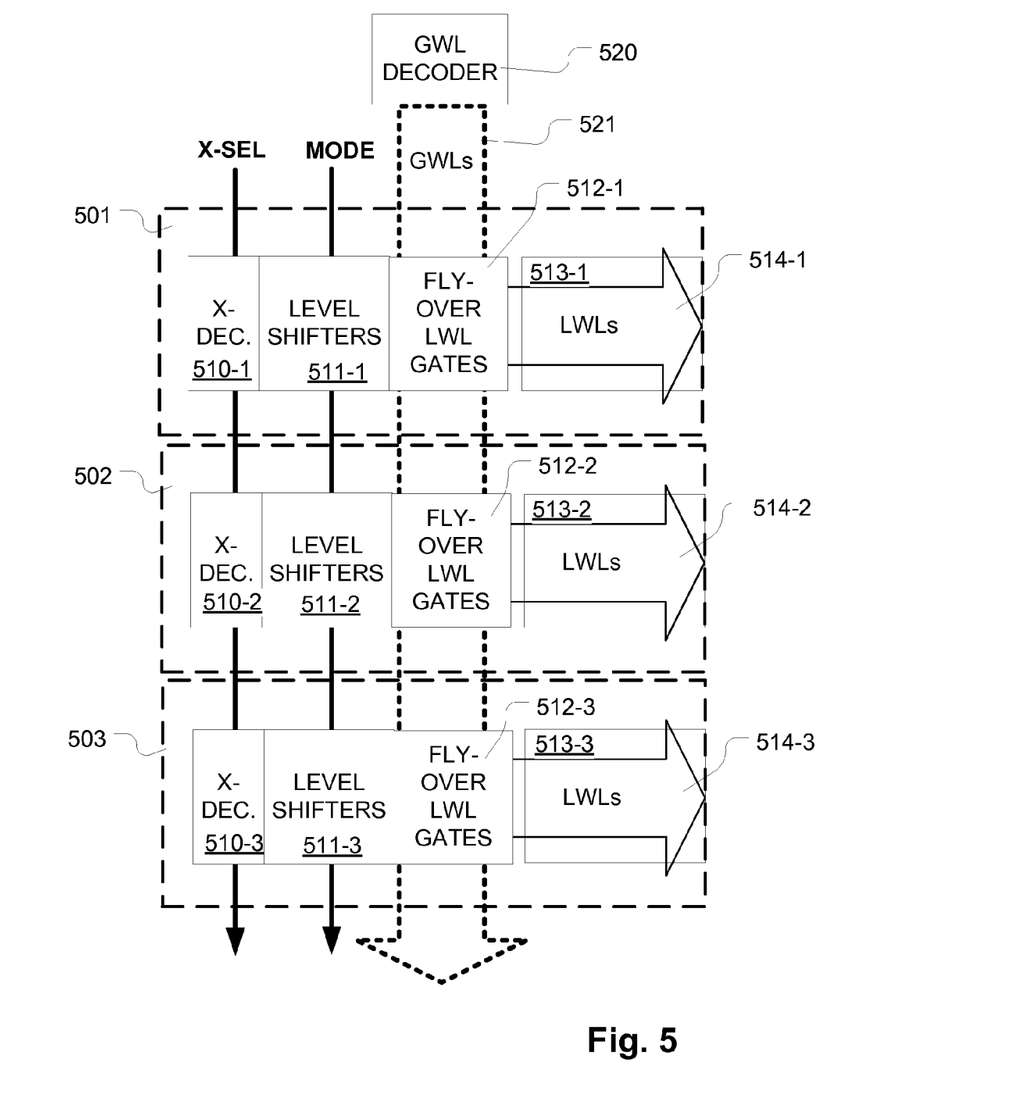
FIG. 5 is a simplified block diagram of a plurality of blocks of a memory array including local word line drivers with pass transistor structures having fly-over conductors.

FIG. 5 is a schematic diagram of a plurality of blocks 501-503 in a memory array. Block 501 includes X-DEC circuit 510-1, level shifter 511-1, local word line driver 512-1, including pass transistors having fly-over conductors, and a set 514-1 of local word lines which extend through a subarray 513-1 of memory cells. Block 502 includes X-DEC circuit 510-2, level shifter 511-2, local word line driver 512-2, including pass transistors having fly-over conductors, and a set 514-2 of local word lines which extend through a subarray 513-2. Block 503 includes X-DEC circuit 510-3, level shifter 511-3, local word line driver 512-3, including pass transistors having fly-over conductors, and a set 514-3 of local word lines which extend through a subarray 513-3.

A global word line decoder 520 generates word line voltages for a set of global word lines 521 which extend through the array to the local word line drivers 512-1, 512-2, 512-3, in a set of blocks arranged in a column in the array, or in a set of blocks arranged as desired. The X-DEC circuits (e.g. 510-3) receive block select signals X-SEL from the block decoder on the integrated circuit, and control enabling the connection of the global word lines to the selected blocks.

The level shifters (e.g. 511-3) are used to produce control signals for the pass transistors and the fly-over conductors in the local word line drivers, such that the gate voltages on the pass transistors are sufficiently high relative to the word line voltages supplied on the global word lines to turn on the pass transistors in selected blocks, and the bias voltages on the fly-over conductors are sufficient to suppress depletion in the pass transistors that could be caused by unwanted trapped charge.

The level shifters can be configured to provide both the control signals for the pass transistors and for the fly-over conductors in response to the X-DEC circuit. In this case, the bias voltages are selectively applied, to turn on and off the pass transistor, and to apply the potential VA to the fly-over conductors when the pass transistor is on. In some embodiments, the potential applied to the fly-over conductor is reduced when the pass transistor is off. Alternatively, the fly-over conductor can be left in floating condition in some circumstances. In yet other embodiments, the potential VA can be applied to the fly-over conductors whenever the memory array is in use, independent of the decoding.

Also, the potential VA applied to the fly-over conductors can be a constant. In other examples, potential VA can vary with time or with the type of operation being executed using the local word line.

In other embodiments, circuits used to apply the bias potential VA can be independent of the level shifters, and disposed on the integrated circuit in positions chosen according to the layout of the particular embodiment.

In some implementations, such as in flash memory, the word line voltages can exceed 20 volts or more during program or erase operations. In such implementations, the level shifters are coupled with charge pumps or other high voltage sources to produce select signals that can be about 5 volts or more higher than the word line voltages, or 25 volts or more. Thus, the pass transistors utilized for the local word lines have breakdown voltages sufficiently high for reliable operation at such high voltages.

Figure 6:
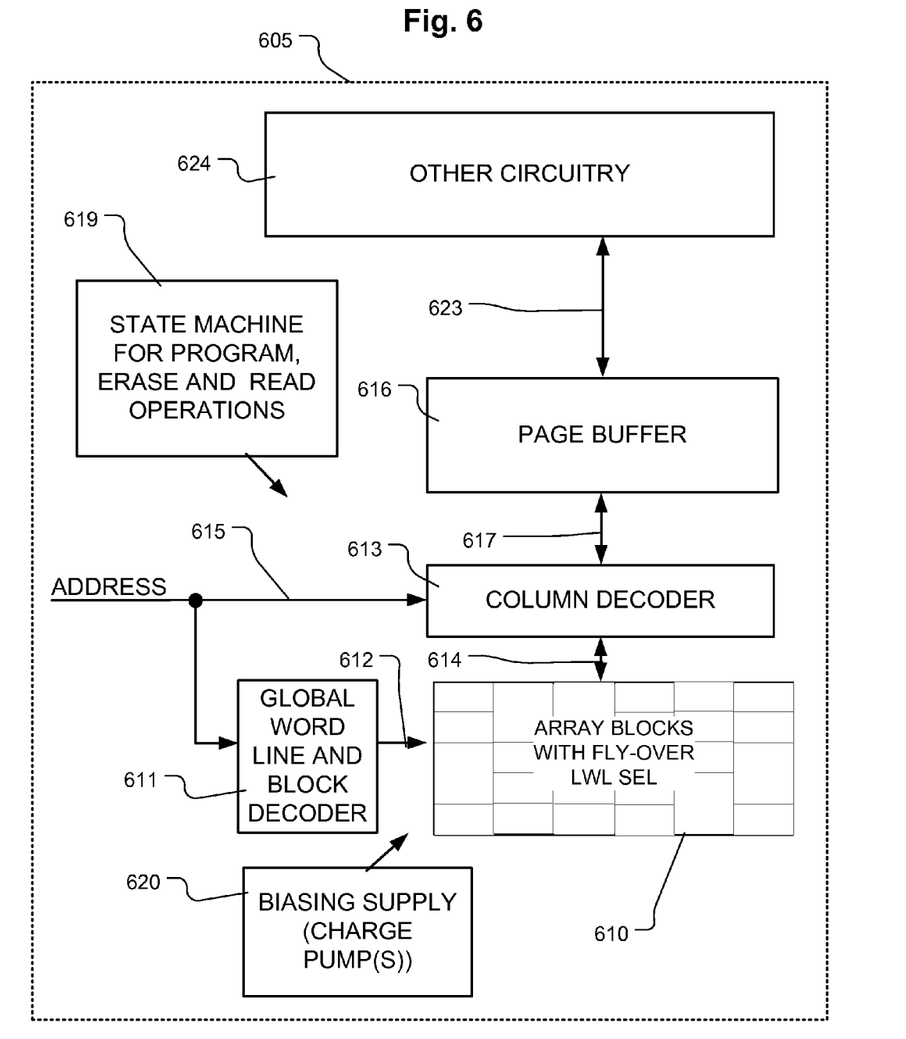
FIG. 6 is a simplified block diagram of an integrated circuit memory including local word line select circuits with pass transistor structures having fly-over conductors.

FIG. 6 is a simplified block diagram of an integrated circuit 605 including a memory array 610 including a plurality of blocks of memory cells, each block including a subarray of memory cells with local word lines. The blocks in this example include, or are coupled with, local word line select transistors, with fly-over conductors configured to reduce the effects of unwanted trapped charge that can arise due to hot carrier stress.

A word line and block decoder 611 drives global word lines and block decode lines (collectively, 612), arranged in the memory array 610. The global word lines supply word line voltages to the local word lines in blocks selected by the block decode lines. In embodiments described herein, each block includes circuits to connect the global word lines to corresponding local word lines using pass transistors disposed in the word line drivers of the local word lines.

A column decoder 613 is coupled to a plurality of global bit lines 614 arranged along columns in the memory array 610 for reading data from and writing data to the memory array 610. Addresses are supplied on bus 615 to decoder 611 and decoder 613. Page buffer circuits 616, including one or more buffers and associated circuitry, are coupled to the column decoder 613, in this example via data lines 617.

The page buffer circuits 616 can be coupled via lines 623 to input/output circuits and other data sources internal or external (collectively "other circuitry" 624) to the integrated circuit 605, such as a general purpose processor or special purpose application circuitry, or a combination of modules providing system-on-a-chip functionality supported by the memory array 610.

In the example shown in FIG. 6, control logic 619 controls the application of supply voltages generated or provided through the voltage supply or supplies in biasing supply circuits 620, such as read, erase, verify and program bias voltages, including voltages on global word lines, bit lines, block select lines and other bias points used in accessing the memory cells storing data in the array. The application of voltages applied to the fly-over conductors is also controlled by a circuit, which can be considered part of the control logic 619 in the example represented by FIG. 6. The voltages applied to the fly-over conductors can be produced using biasing supply circuits 620 on the integrated circuit 605.

Figure 7:
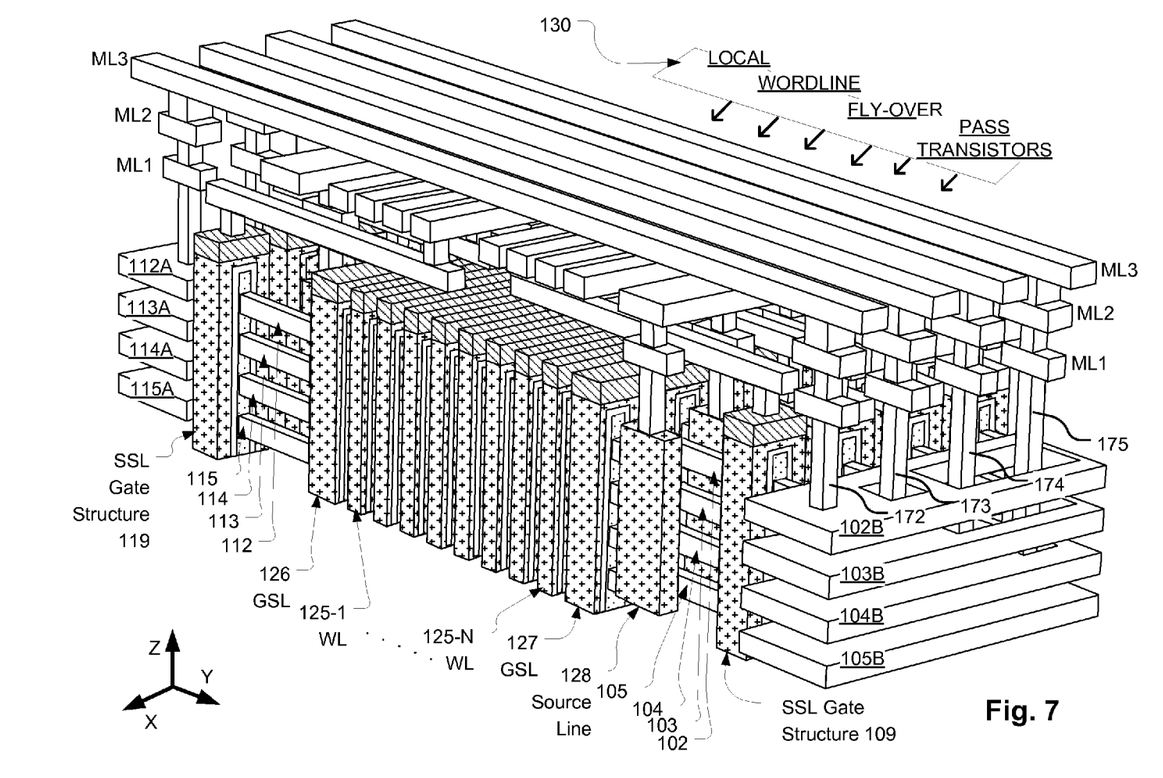
FIG. 7 illustrates a block of memory cells in a 3D vertical gate NAND flash array structure, for which the technology described herein can be applied.

FIG. 7 is a perspective illustration of a block of memory cells of a three-dimensional (3D) integrated circuit device, which provides one example of a block including a subarray of memory cells of an array (such as array 610 in FIG. 6), and is suitable for use in a product like that represented by FIG. 6.

The device illustrated in FIG. 7 includes a plurality of stacks of active strips acting as channel lines in NAND strings, alternating with insulating strips. Insulating material is removed from the drawing to expose additional structure. For example, insulating strips are removed between the active strips in the stacks, and are removed between the stacks of active strips. This structure is described herein in some detail, as an example of a three-dimensional (3D) memory array which can be manufactured on a semiconductor substrate, in combination with peripheral circuits on the substrate (not shown), including local word line drivers and a fanout structure for connection of the local word lines to the local word line drivers (represented by block 130) having high voltage pass transistors with fly-over conductors as described herein.

In the example shown in FIG. 7, a multilayer array is formed on an insulating layer, and includes a plurality of local word lines 125-1 WL through 125-N WL conformal with the plurality of stacks. The local word lines extend to the structure 130, at which word line voltages from global word lines are supplied to the corresponding local word lines in the block using pass transistors with fly-over conductors biased to neutralize effects of unwanted trapped charge as discussed above.

The plurality of stacks includes active strips 112, 113, 114, and 115 in multiple planes. Active strips in the same plane are electrically coupled together by contact pads (e.g. 102B).

A contact structure including a stack of contact pads 112A, 113A, 114A, and 115A terminate active strips, such as the active strips 112, 113, 114, and 115 in the plurality of stacks. As illustrated, these contact pads 112A, 113A, 114A, and 115A are electrically connected to different bit lines for connection to decoding circuitry to select planes within the array. These contact pads 112A, 113A, 114A, and 115A can be patterned at the same time that the plurality of stacks is defined.

A contact structure including a stack of contact pads 102B, 103B, 104B, and 105B terminate active strips, such as active strips 102, 103, 104, and 105. As illustrated, interlayer connectors 172, 173, 174, 175 electrically connect contact pads 102B, 103B, 104B, and 105B to different bit lines in metal layers, such as a metal layer ML3, for connection to decoding circuitry to select planes within the array. The stack of contact pads 102B, 103B, 104B, and 105B can be patterned at the same time that the plurality of stacks is defined.

In this example, any given stack of active strips is coupled to either the stack of contact pads 112A, 113A, 114A, and 115A, or the stack of contact pads 102B, 103B, 104B, and 105B, but not both. The stack of active strips 112, 113, 114, and 115 is terminated at one end by the stack of contact pads 112A, 113A, 114A, and 115A, passes through SSL gate structure 119, ground select line GSL 126, local word lines 125-1 WL through 125-N WL, ground select line GSL 127, and is terminated at the other end by source line 128. The stack of active strips 112, 113, 114, and 115 does not reach the stack of contact pads 102B, 103B, 104B, and 105B.

The stack of active strips 102, 103, 104, and 105 is terminated at one end by the stack of contact pads 102B, 103B, 104B, and 105B, passes through SSL gate structure 109, ground select line GSL 127, local word lines 125-N WL through 125-1 WL, ground select line GSL 126, and is terminated at the other end by a source line (obscured by other parts of the figure). The stack of active strips 102, 103, 104, and 105 does not reach the stack of contact pads 112A, 113A, 114A, and 115A.

A layer of memory material is disposed in interface regions at cross-points between surfaces of the active strips 112-115 and 102-105 and the plurality of local word lines 125-1 WL through 125-N WL. In particular, the layer of memory material is formed on side walls of the active strips in the plurality of stacks. Ground select lines GSL 126 and GSL 127 are conformal with the plurality of stacks, similar to the local word lines.

Every stack of active strips in this example is terminated at one end by contact pads and at the other end by a source line. For example, the stack of active strips 112, 113, 114, and 115 is terminated at one end by contact pads 112A, 113A, 114A, and 115A, and terminated on the other end by a source line 128. At the near end of the figure, every other stack of active strips is terminated by the contact pads 102B, 103B, 104B, and 105B, and every other stack of active strips is terminated by a separate source line. At the far end of the figure, every other stack of active strips is terminated by the contact pads 112A, 113A, 114A, and 115A, and every other stack of active strips is terminated by a separate source line.

Bit lines and string select gate structures are formed at the metals layers ML1, ML2, and ML3. Bit lines are coupled to a plane decoder (not shown). String select gate structures are coupled to a string select line decoder (not shown).

The ground select lines GSL 126 and 127 can be patterned during the same step that the local word lines 125-1 WL through 125-N WL are defined. In some embodiments, a ground select line decoder can include pass transistors with fly-over conductors. Ground select devices are formed at cross-points between surfaces of the plurality of stacks and ground select lines GSL 126 and 127. The SSL gate structures 119 and 109 can be patterned during the same step in which the local word lines 125-1 WL through 125-N WL are defined. In some embodiments, the string select line decoder can include pass transistors with fly-over conductors. String select devices are formed at cross-points between surfaces of the plurality of stacks and string select (SSL) gate structures 119 and 109. These devices are coupled to decoding circuitry for selecting the strings within particular stacks in the array.

Although the subarray shown in FIG. 7 is representative of a block of flash memory cells in a 3D NAND configuration suitable for use with the technology described herein for connecting global word lines to local word lines, other memory structures can be utilized, including other configurations of 3D vertical gate structures, 3D vertical channel structures, 2D arrays, arrays in NOR configurations, arrays in AND configurations and other memory structures. Also, other memory cell technologies can be utilized, including all types of volatile and nonvolatile memory suitable for arrangement in blocks with local word lines as described herein.

A method for manufacturing a transistor with a fly-over structure is therefore provided. The method includes forming a transistor having a gate, a channel and a source/drain terminal. A fly-over conductor is disposed over the source/drain terminal, with insulating material electrically insulating the fly-over conductor from the source/drain terminal. A circuit is formed that is connected to the fly-over conductor to apply a bias voltage tending to neutralize an electric field induced by charge trapped in the insulating material. In addition, a circuit can be provided that is connected to the gate of the transistor to apply a gate voltage to selectively turn on and turn off the transistor.

A method for operating a transistor is described. The method includes applying a gate voltage to selectively control transfer of a voltage from an input side source/drain terminal to an output side source/drain terminal of the transistor, and inducing an electric field over the output side source/drain terminal tending to neutralize an electric field induced by charge trapped in insulating material over the output side source/drain terminal by, for example, using a fly-over conductor.

The transistor structure described herein, including fly-over conductors, is suitable for use in local word line drivers for high density memory as discussed above. In addition, the transistor structure can be deployed in other environments, including low voltage and high voltage applications, in which unwanted trapped charge can affect the drive ability of the transistor.

The technology can be deployed with a simple modification of the layout of a patterned metal layer, along with the addition of circuitry for biasing the fly-over conductors. This enables deployment of the technology for very low cost, and with very little layout penalty.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A device comprising:
    a transistor having a gate, a channel under the gate and a first source/drain terminal, the channel being doped with impurities that establish a first conductivity type, and the first source/drain terminal being doped with impurities that establish a second conductivity type different from the first conductivity type, wherein the first source/drain terminal includes a more lightly doped region and a more heavily doped region;
    a fly-over conductor disposed over the first source/drain terminal, separated from the first source/drain terminal and from the gate by insulating material, and laterally spaced away from the gate and the channel;
    a circuit including the transistor connected to the fly-over conductor to apply a bias voltage tending to offset effects on the transistor of charge trapped in the insulating material; and
    an output conductor is connected to the first source/drain terminal, wherein the fly-over conductor is a lateral extension of the output conductor, which at least partly overlies the more lightly doped region.

2. The device of claim 1, wherein the circuit connected to the fly-over conductor selectively applies the bias voltage when the transistor is turned on.

3. The device of claim 1, wherein the transistor includes a second source/drain terminal and a circuit connected to the second source/drain terminal to apply a voltage to the second source/drain terminal, and the transistor transfers the voltage from the second source/drain terminal to the first source/drain terminal when the transistor is turned on.

4. The device of claim 1, including an array of transistors, the array including said transistor, and wherein the fly-over conductor is disposed in a pattern so that it passes over first source/drain terminals in more than one of the transistors in the array.

5. The device of claim 1, wherein the transistor includes a second source/drain terminal, and further including:
    a memory array having global word lines and local word lines; and
    a circuit connected to the second source/drain terminal to apply a voltage being transferred from the second source/drain terminal to the first source/drain terminal when the transistor is turned on, the first source/drain terminal being electrically connected to a local word line in the array and the second source/drain terminal being electrically connected to a global word line in the array.

6. The device of claim 1, wherein the fly-over conductor is passively electrically connected to the output conductor, and the circuit that applies a bias voltage to the fly-over conductor is connected to the output conductor.

7. The device of claim 1, wherein the gate includes a sidewall structure, and wherein the fly-over conductor at least partly overlies the sidewall structure.

8. A device comprising:
    a substrate;
    an array of memory cells on the substrate, including a row/column line;
    a transistor having a gate, a first source/drain terminal, a channel under the gate and a second source/drain terminal, the channel being doped with impurities that establish a first conductivity type, and the first source/drain terminal being doped with impurities that establish a second conductivity type different from the first conductivity type, the row/column line being electrically connected to the first source/drain terminal, wherein the first source/drain terminal includes a more lightly doped region and a more heavily doped region;
    a fly-over conductor disposed over the first source/drain terminal and laterally spaced away from the gate and the channel, and separated from the first source/drain terminal and from the gate by insulating material, wherein the fly-over conductor is a lateral extension of the row/column line, which at least partly overlies the more lightly doped region;

a select line including, or connected to, said gate;

a bias voltage generator which applies a bias voltage to the fly-over conductor tending to neutralize an electric field induced by charge trapped in the insulating material; and a row/column line select signal generator which produces a select signal, connected to the select line.

9. The device of claim 8, including a plurality of transistors, including said transistor, and wherein the array includes a plurality of blocks of memory cells, said row/column line being one of a plurality of local word lines disposed in one of the blocks, and the local word lines in the plurality of local word lines being electrically connected to corresponding transistors in the plurality of transistors.

10. The device of claim 9, including a row/column line voltage generator with connections to second source/drain regions in the plurality of transistors, and the word line row/column line voltage generator generating voltages for corresponding ones of the plurality of local word lines.

11. The device of claim 10, wherein the row/column line voltage generator comprises a global word line driver coupled to transistors in the plurality of blocks.

12. The device of claim 8, wherein the row/column line select signal generator includes a level shifter, and produces the select signal at a voltage level sufficient as compared to a voltage on the row/column line, to turn on the transistor when the row/column line is selected.

13. The device of claim 8, wherein said array comprises a 3D array.

14. The device of claim 8, including a connecting line having a major axis extending to the row/column line, and having a digitated layout feature extending laterally from the major axis and an interlayer contact, connecting the digitated layout feature with the first source/drain terminal.

15. The device of claim 8, wherein the fly-over conductor is passively and electrically connected to the row/column line, and the bias voltage generator is connected to the second source/drain terminal.

16. The device of claim 8, wherein the gate includes a sidewall structure, and the fly-over conductor at least partly overlies the sidewall structure.

\* \* \* \* \*